(12) United States Patent
Wang et al.

(10) Patent No.: US 8,372,755 B2
(45) Date of Patent: Feb. 12, 2013

(54) MULTILAYER HARD MASK

(75) Inventors: Shiang-Bau Wang, Pingzchen (TW);
Hun-Jan Tao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 488 days.

(21) Appl. No.: 12/686,866

(22) Filed: Jan. 13, 2010

(65) Prior Publication Data

US 2011/0171804 A1   Jul. 14, 2011

(51) Int. Cl.
*H01L 21/302* (2006.01)
*H01L 29/66* (2006.01)

(52) U.S. Cl. ........................... 438/717; 257/287

(58) Field of Classification Search .......... 438/180–186, 438/717, 736; 257/287, 332, E21.025, E21.034
See application file for complete search history.

(56) References Cited

U.S. PATENT DOCUMENTS

| | | |
|---|---|---|
| 6,440,858 B1 | 8/2002 | Canale et al. |
| 6,479,391 B2 | 11/2002 | Morrow et al. |
| 6,828,161 B2 * | 12/2004 | Summerfelt et al. ............. 438/3 |
| 7,518,196 B2 * | 4/2009 | Chau et al. .................... 257/401 |
| 2011/0073940 A1 * | 3/2011 | Lee et al. ...................... 257/332 |

* cited by examiner

*Primary Examiner* — Calvin Lee
(74) *Attorney, Agent, or Firm* — Haynes and Boone LLP

(57) ABSTRACT

A method for fabricating a semiconductor device is disclosed. In an embodiment, the method may include providing a semiconductor substrate; forming gate material layers over the semiconductor substrate; forming a multi-layer hard mask layer over the gate material layers, wherein the multi-layer hard mask layer includes a plurality of film stacks, each film stack having a silicon oxide layer and a carbon-containing material layer, each film stack having a thickness equal to or less than about 10 angstrom; patterning the multi-layer hard mask layer, forming an opening of the multi-hard mask layer; etching the gate material layers within the opening of the multi-layer hard mask layer, forming a gate structure; performing a tilt-angle ion implantation process to the semiconductor substrate, wherein a first remaining thickness of the multi-layer hard mask layer is less than a first thickness; and thereafter performing an epitaxy growth to the semiconductor substrate, wherein a second remaining thickness of the multi-layer hard mask layer is greater than a second thickness.

21 Claims, 7 Drawing Sheets

MULTILAYER HARD MASK

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

SUMMARY

A method for fabricating a semiconductor device is provided. In an embodiment, the method may include providing a semiconductor substrate; forming gate material layers over the semiconductor substrate; forming a multi-layer hard mask layer over the gate material layers, wherein the multi-layer hard mask layer includes a plurality of film stacks, each film stack having a silicon oxide layer and a carbon-containing material layer, each film stack having a thickness equal to or less than about 10 angstrom; patterning the multi-layer hard mask layer, forming an opening of the multi-hard mask layer; etching the gate material layers within the opening of the multi-layer hard mask layer, forming a gate structure; performing a tilt-angle ion implantation process to the semiconductor substrate, wherein a first remaining thickness of the multi-layer hard mask layer is less than a first thickness; and thereafter performing an epitaxy growth to the semiconductor substrate, wherein a second remaining thickness of the multi-layer hard mask layer is greater than a second thickness.

In an embodiment, the method for fabricating a semiconductor device includes providing a semiconductor substrate; forming gate material layers over the semiconductor substrate; forming a multi-layer hard mask layer over the gate material layers, wherein the multi-layer hard mask layer includes a plurality of film stacks, each film stack having a first material film having a high resistance to an oxygen plasma process and a second material film having a high resistance to an etching process; patterning the multi-layer hard mask layer, forming an opening of the multi-hard mask layer; etching the gate material layers within the opening of the multi-layer hard mask layer, forming a gate structure; performing a tilt-angle ion implantation process to the semiconductor substrate; thereafter performing various processes to the semiconductor substrate, wherein the various processes include etching and oxygen plasma treatment; and thereafter performing an epitaxy growth to the semiconductor substrate to form an epitaxy layer adjacent the gate structure.

In another embodiment, the method for manufacturing a semiconductor device include forming gate material layers over a semiconductor substrate; forming a multi-layer hard mask layer over the gate material layers, wherein the multi-layer hard mask layer includes a plurality of dual films stacked together, each dual film having a first material film having a high resistance to an oxygen plasma process and a second material film having a high resistance to an etching process, each material film have a thickness less than about 10 angstrom; patterning the gate material layers utilizing the multi-layer hard mask layer; performing a tilt-angle ion implantation process to the semiconductor substrate, wherein the multi-layer hard mask layer has a thickness less than about 450 angstrom; thereafter performing, to the semiconductor substrate, various processes including etching and oxygen plasma treatment; and thereafter performing an epitaxy growth to the semiconductor substrate while the multi-layer hard mask layer has a thickness greater than about 200 angstrom.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
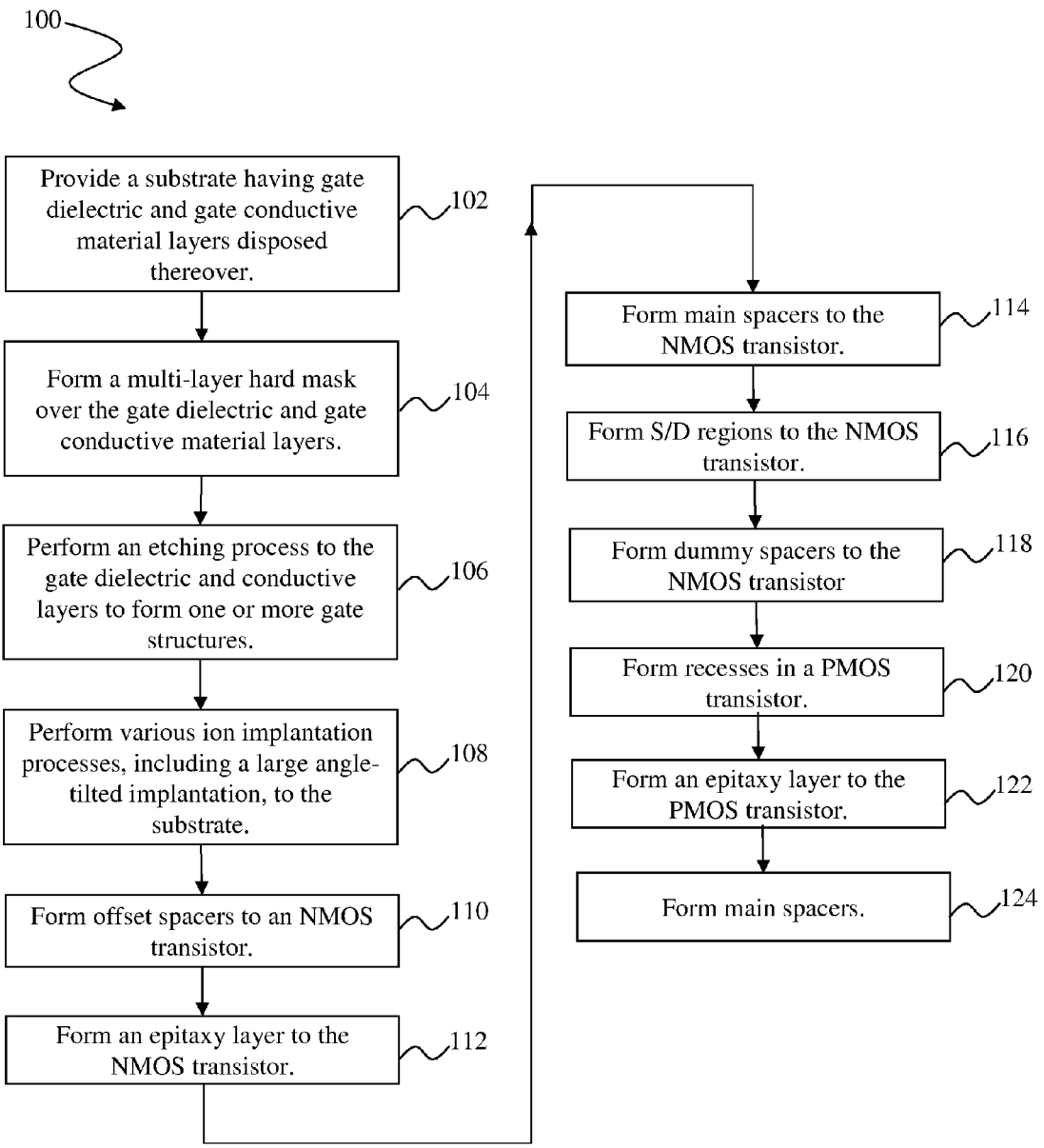
FIG. 1 is a flow chart of a method for fabricating an integrated circuit device according to aspects of the present disclosure.

The present disclosure relates generally to methods for manufacturing integrated circuit devices, and more particularly, to hard mask layers utilized for manufacturing integrated circuit devices.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2A-2L, a method 100 and a semiconductor device 200 are collectively described below. The semiconductor device 200 illustrates an integrated circuit, or portion thereof, that can comprise memory cells and/or logic circuits. The semiconductor device 200 can include active components, such as metal-oxide-semiconductor field effect transistors (MOSFETs), complementary metal-oxide-semiconductor transistors (CMOSs), high voltage transistors, and/or high frequency transistors; other suitable components; and/or combinations thereof. The semiconductor device 200 may additionally include passive components such as resistors, capacitors, inductors, and/or fuses. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2A:
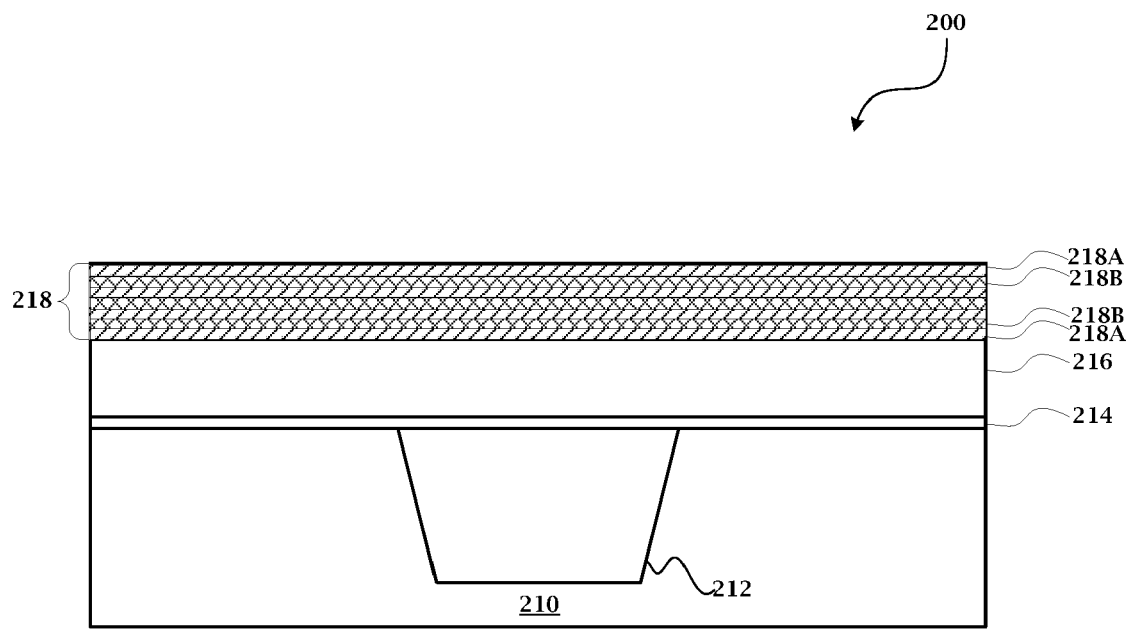
FIGS. 2A-2L are various cross-sectional views of embodiments of an integrated circuit device during various fabrication stages according to the method of FIG. 1.

Referring to FIGS. 1 and 2A, the method 100 begins at block 102 wherein a substrate 210 is provided. In the present embodiment, the substrate 210 is a semiconductor substrate comprising silicon. Alternatively, the substrate 210 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 may include various doped regions depending on design requirements as known in the art (e.g., p-type wells or n-type wells). The doped regions may be doped with p-type dopants, such as boron or $BF_2$, and/or n-type dopants, such as phosphorus or arsenic. The doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor (referred to as an NMOS) and regions configured for a P-type metal-oxide-semiconductor transistor (referred to as a PMOS). It is understood that the semiconductor device 200 may be formed by CMOS technology processing, and thus some processes are not described in detail herein.

An exemplary isolation region 212 is formed on the substrate 210 to define and isolate various active regions of the substrate 210, and in the present embodiment, to isolate the NMOS and PMOS device regions. The isolation region 212 utilizes isolation technology, such as shallow trench isolation (STI) or local oxidation of silicon (LOCOS), to define and electrically isolate the various regions. In the present embodiment, the isolation region 212 includes a STI. The isolation region 212 comprises silicon oxide, silicon nitride, silicon oxynitride, other suitable materials, or combinations thereof. The isolation region 212 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure such as a thermal oxide liner layer filled with silicon nitride and/or silicon oxide. Then a polishing process, such as chemical mechanic polishing (CMP) process, is applied to remove the excessive dielectric materials above the top surface of the substrate, and produce a globally planarized surface.

Various gate material layers are formed over the substrate 210. In the present embodiment, the gate material layers include a gate dielectric layer 214 and a gate conductive layer (or gate electrode) 216. The gate dielectric layer 214 is formed over the substrate 210 by any suitable process to any suitable thickness. The gate dielectric layer 214 comprises a dielectric material, such as silicon oxide, silicon oxynitride, silicon nitride, high k dielectric material layer, other suitable dielectric materials, and/or combinations thereof. In various embodiments, the high-k dielectric material may comprise $HfO_2$, HfSiO, HfSiON, HfTaO, HfTiO, HfZrO, other suitable high-k dielectric materials, and/or combinations thereof. The gate dielectric layer may include a multilayer structure. In the present example, the gate dielectric layer 214 includes an interfacial layer, and a high k dielectric material layer formed on the interfacial layer. The interfacial layer comprises a grown silicon oxide layer formed by a thermal process or atomic layer deposition (ALD). The high k dielectric material can be formed by a suitable process including ALD.

The gate conductive layer 216 is formed over the gate dielectric layer 214 by any suitable process to any suitable thickness. In the present embodiment, the gate layer 216 is a polycrystalline silicon (or polysilicon) layer. The polysilicon layer may be doped for proper conductivity. Alternatively, the polysilicon is not necessarily doped if a dummy gate is to be formed and is replaced in a subsequent gate replacement process. In one embodiment, the gate conductive layer 216 may comprise a conductive layer having a proper work function, therefore referred to as a work function layer. The work function layer comprises any suitable material, such that the layer can be tuned to have a proper work function for enhanced performance of the associated device. For example, if a P-type work function metal (P-metal) for a PMOS device is desired, TiN, or TaN may be used. On the other hand, if an N-type work function metal (N-metal) for NMOS devices is desired, Ta, TiAl, TiAlN, or TaCN, may be used. The work function layer may include doped conducting oxide materials. The gate conductive layer 216 may additionally comprise other conductive materials, such as aluminum, copper, tungsten, metal alloys, metal silicide, other suitable materials, and/or combinations thereof, formed on the work functional layer. The gate conductive layer can be formed by any proper technique, such chemical vapor deposition (CVD), physical vapor deposition (PVD), atomic layer deposition (ALD), high density plasma CVD (HDPCVD), plating, other suitable methods, and/or combinations thereof.

Conventional semiconductor processing utilizes only a single hard mask layer, which protects the material layer and/or defines a pattern to be transferred to the material layer during subsequent processing. The subsequent processing typically exposes the semiconductor device 200 to a variety of etching processes, including numerous dry etching and/or wet etching processes; ashing (e.g., $O_2$ ashing process) and/or stripping processes; cleaning processes; and combinations thereof. A dry etching process may be implemented in an etching chamber using process parameters including a radio frequency (RF) or microwave source power, a bias power, a pressure, a flow rate, a wafer temperature, other suitable process parameters, and/or combinations thereof. The dry etching process may implement an oxygen-containing gas, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. A wet etching process may utilize a hydrofluoric acid (HF) solution for a HF dipping process and/or a dilute APM process using a $NH_4OH:H_2O_2:H_2O$ solution. The HF or APM solution may have any suitable concentration (e.g., 1:100 for an HF solution or 1:6:25 for an APM solution) at a suitable temperature (e.g., elevated or room temperature). The wet etching process may alternatively apply a diluted hydrofluoric acid (DHF) to the semiconductor device 200.

It has been observed that the conventional single hard mask layer cannot adequately withstand the multiple processes, such as the multiple etching steps/solutions, ashing steps, and/or cleaning steps. It has further been observed that the single hard mask layer may perform well when exposed to wet etching processes, yet not perform well when exposed to dry etching processes or ashing processes, and vice versa. Single hard mask layers that exhibit desirable characteristics for withstanding wet etching processes include SiC, SiOC, SiCN, ashing removable dielectric (ARD) layers, photoresist (PR) layers, and/or metal hard mask layers (e.g., TiN). However, any one of these materials may not exhibit ideal etching resistance during ashing processes, such as $O_2$ ashing processes, and/or may introduce contamination. Other examples include a single $SiO_2$ hard mask layer that provides less than desirable etching resistance when exposed to a HF wet etching solution; a single SiON or SiN hard mask layer that provides less than desirable etching resistance when exposed to a $H_3PO_4$ wet etching solution; or a single oxide hard mask layer, such as an oxide layer deposited by a plasma enhanced CVD oxide (referred to as a PE oxide), that provides less than desirable etching resistance when exposed to a dry etching process, such as a SiN dry etching process.

Further, varying heights of the hard mask layer are desired at each processing stage. Since the single hard mask does not perform well during dry etching, wet etching, ashing/stripping, and cleaning processes, the height of the single hard mask layer may produce undesired side effects. For example, before a pocket implantation and/or lightly doped drain (LDD) implantation, it is desired that the hard mask layer is not too thick. If the hard mask layer is too high, it may produce shadow effects, particularly as technology nodes continue to decrease (45 nm, 32 nm, 22 nm technology nodes and beyond) and the spacing between devices shrink. During a source/drain formation process including an etch process to form a recessed substrate and an epitaxial growth process, it is desired that the hard mask layer is not too thin. If the hard mask layer is too low, mushroom effects may arise, causing unintended growth portions on the gate stack. In a specific process example, desirably, the hard mask layer is less than approximately 450 Å to avoid the shadowing effects occurring during a pocket/LDD implantation process, yet the hard mask layer is greater than 200 Å to prevent mushroom window side effects during an epitaxial growth source/drain process. The single hard mask layer utilized in conventional processing fails to provide sufficient thickness control and the ability to reduce side effects related to hard mask layer thickness.

Accordingly, the present disclosure proposes a multi-layer hard mask layer. The multi-hard mask layer includes layers of differing etching characteristics, such as etching selectivities, so that the height of the hard mask layer may be better controlled. At block 104, a multi-layer hard mask layer 218 is formed over the gate material layer (e.g., the gate dielectric layer 214 and gate layer 216) by any suitable process. The multi-layer hard mask layer 218 comprises any suitable combination of hard mask layer materials. Particularly, the multi-layer hard mask layer 218 includes a first layer of a first (hard mask) material and a second layer of a second (hard mask) material. The first hard mask material has a higher processing resistance to oxygen treatment, such as oxygen ashing. In one embodiment, the first hard mask material includes silicon oxide ($SiO_2$). In one example, the silicon oxide is formed by plasma enhanced chemical vapor deposition (PECVD). In furtherance of the present example, silane (SiH4) is employed to form silicon oxide. The second hard mask material has a higher processing resistance to wet process and dry process, such as wet etching, wet cleaning, and dry etching. In one embodiment, the second hard mask layer includes SiOC. The second hard mask material may alternatively include SiCN or SiC. In one example, a layer of the second hard mask material is formed by PECVD. In furtherance of the present example, SiH4, C2, N2, and N2O, or a subset thereof is employed to form the second hard mask material. The second hard mask layer has a lower processing resistance to the oxygen treatment compared to the first hard mask material. Similarly, the first hard mask layer has a lower processing resistance to the hydrofluoric solution (HF), such as diluted HF (DHF).

The multi-layer hard mask layer 218 is formed by depositing alternating layers. The alternating layers include a first layer of the first hard mask material 218A and a second layer of the second hard mask material 218B, wherein the multi-layer hard mask layer 218 includes alternating first and second layers. In the present embodiment, the multi-layer hard mask layer 218 includes alternating $SiO_2$ layer 218A and SiOC (or SiCN or SiC) layer 218B. The SiOC (or SiCN or SiC) layers exhibit a high resistance to wet etching and dry etching processes, but not ashing processes, such as $O_2$ ashing processes. The $SiO_2$ layers exhibit a high resistance for ashing processes, such as $O_2$ ashing processes, but not for some wet etching processes, such as a DHF wet etching process. Thus, if the etching selectivity of the alternating layers is tuned, the multi-layer hard mask layer 218 may be tuned to lose about one layer for each process. As will be further discussed below, controlling the loss of the hard mask layer during subsequent processing provides the hard mask layer at particular heights/thicknesses for each process, which can reduce process side effects resulting from the height/thickness of the hard mask layer.

The thickness of the multi-layer hard mask layer 218 is any suitable thickness. An exemplary multi-layer hard mark layer 218 comprises a thickness of approximately 750 Å. The thickness of each layer of the multi-layer hard mask layer 218 is also any suitable thickness. For example, the thickness of each layer 218A, 218B is approximately 10 nm or less. In the present embodiment, the thickness of the layers 218A, 218B is approximately 5 nm or less. It should be noted that the thickness of the layers 218A, 218B may be tuned so that the overall thickness of the multi-layer hard mask layer 218 exhibits a thickness that will reduce processing side effects at each subsequent processing stage.

Referring to FIGS. 1 and 2B-2L, subsequent processing steps are performed to further fabricate the semiconductor device 200. It is understood that the process described in FIGS. 2B-2L is merely an example, and other processing sequences are contemplated. Though not shown in FIGS. 2B-2L, portions of the multi-layer hard mask layer 218 may be removed during each subsequent process. Thus, the thickness of the multi-layer hard mask layer 218 varies throughout the fabrication of semiconductor device 200. The layers 218A, 218B of the multi-layer hard mask layer 218 are tuned to have varying etching resistance. Tuning the various layers of the multi-layer hard mask layer 218 provides better height/thickness control, which may reduce side effects occurring in subsequent processing, and thus, may improve overall device performance.

Figure 2B:
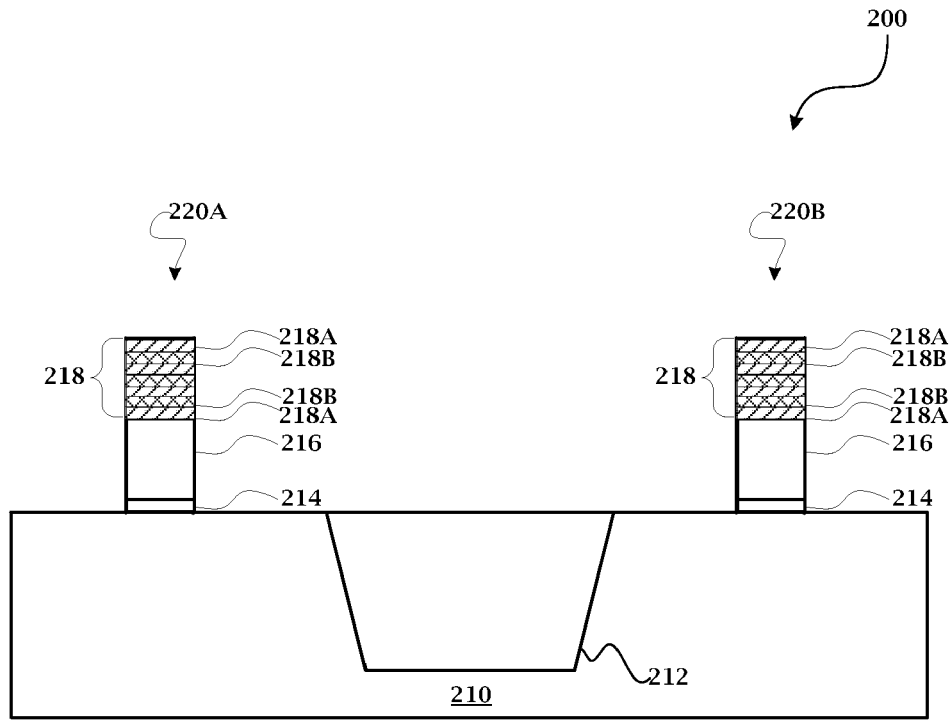

In the present embodiment, the method 100 proceeds to step 106 by performing an etching process to the gate dielectric layer 214 and gate conductive material layer 216 to form one or more gate structures. For example, as illustrated in FIG. 2B, a gate structure 220A configured for a PMOS device, and a gate structure 220B configured for an NMOS device are formed. It is understood that a plurality of gate structures 220A, 220B may be formed. In one embodiment, the gate structures 220A, 220B are formed by a procedure including photolithography patterning, and etching processes. For example, a patterned photoresist layer is formed on the multi-layer hard mask 218 by a photolithography patterning process. An etching process is applied to the hard mask layer within the openings of the patterned photoresist layer to removed the hard mask layer therewithin, forming the patterned hard mask, as illustrated in FIG. 2B. A second etching process (gate etching) is applied to the gate dielectric and gate conductive layers to remove the gate dielectric and gate conductive layers within the openings of the patterned hard mask. The patterned photoresist layer is removed by a process, such as ashing or wet stripping, after the gate etching or alternatively before the gate etching. The photolithography patterning process may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, or a combination thereof. In the present embodiment, a dry etching procedure is applied to pattern the gate dielectric and gate conductive layers. More particularly, the etchant used in the gate etching includes $CF_4$, HBr, $SF_6$, $O_2$, $Cl_2$, or combinations thereof.

Figure 2C:
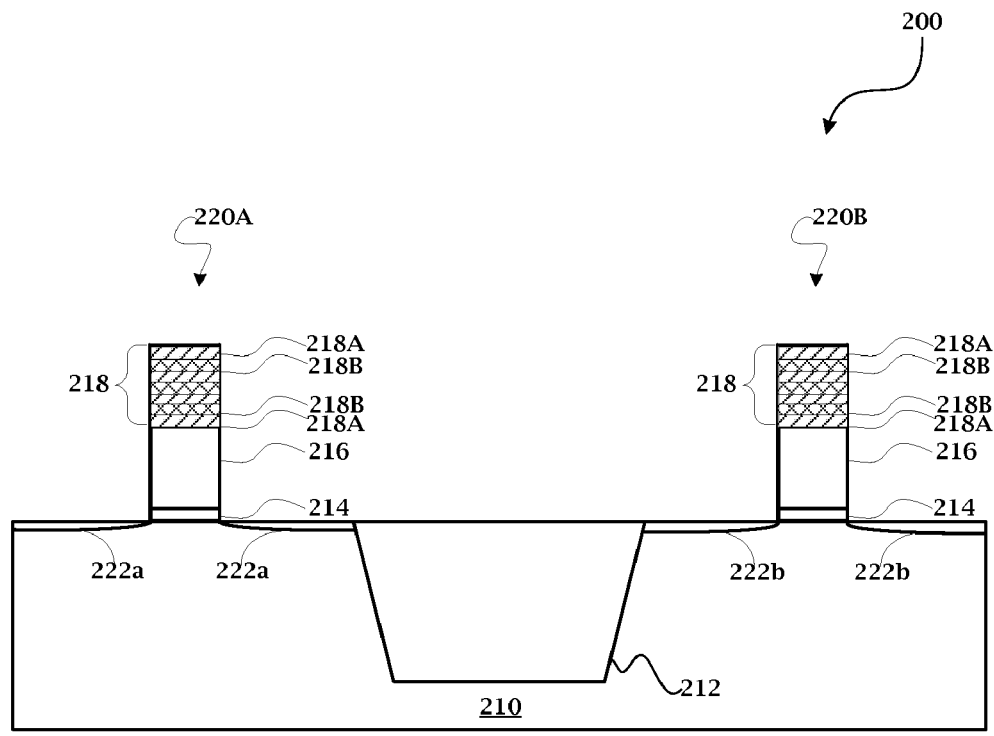

Referring to FIG. 1 and FIG. 2C, the method 100 proceeds to step 108 by performing various implantation processes on the substrate 210. The various implantation process may form various doped regions. The doped regions may be doped n-type and/or p-type and may comprise various doping profiles. In the present embodiment, lightly doped drain (LDD) regions 222a, 222b are formed by one or more ion implantation processes. If the gate structure 220A is for PMOS transistor, the associated LDD regions 222a include p-type dopant. If the gate structure 220B is for NMOS transistor, the associated LDD regions 222b include n-type dopant. In this situation, the LDD regions 222a and 222b are formed separately by different ion implantation procedures and using different dopants.

In one embodiment, the various implantation processes includes an tilt-angle ion implantation, such as a large-angle tilted halo/pocket implantation implemented to eliminate short channel effects (e.g., punch-through effect). The tilt-angle ion implantation process implements an ion beam with an angle to a direction perpendicular to the substrate. In one embodiment, the large-angle tilted ion implantation is implemented with a suitable tilt angle tuned to form a pocket implant. In the present embodiment, a tilt-angle of approximately 25° is utilized. The tilt-angle implantation may be subject to side effects, such as shadowing effects present from the gate stacks of gate structures 220A, 220B. In this case, the ions to be implanted cannot effectively reach to the substrate. As technology nodes continue to decrease, particularly to 22 nm technology nodes and beyond, the spacing between gate stacks continues to decrease, which affects the pocket implantation process. Further, the height of the hard mask layer can exacerbate the shadow effects when the hard mask layer is too high. As noted above, some conventional single hard mask layers, due to a low etching selectivity to the gate stack etching processes, are too thick for the pocket implantation process, resulting in greater than desirable shadow effects. It has been observed that a hard mask layer height of 450 Å or less at pocket implantation step may reduce shadow effects, and may provide use of a 25° tilt angle. The multi-layer hard mask layer 218 disclosed in the present invention exhibits a height of 450 Å or less after the gate stack etching processes.

In one embodiment, the ion implantation processes include a first LDD implantation with a tilt-angle of about 25°. The first LDD implantation is implemented after a patterned photoresist layer is formed and is used as an implanting mask.

After the first LDD implantation, the patterned photoresist layer is removed by a process, such as oxygen ashing and/or DHF cleaning. In furtherance of the embodiment, the ion implantation processes further includes one or more additional LDD implantations, such as second LDD implantation through sixth implantation designed for tuning various electrical parameters including threshold voltage and current in one example.

Figure 2D:
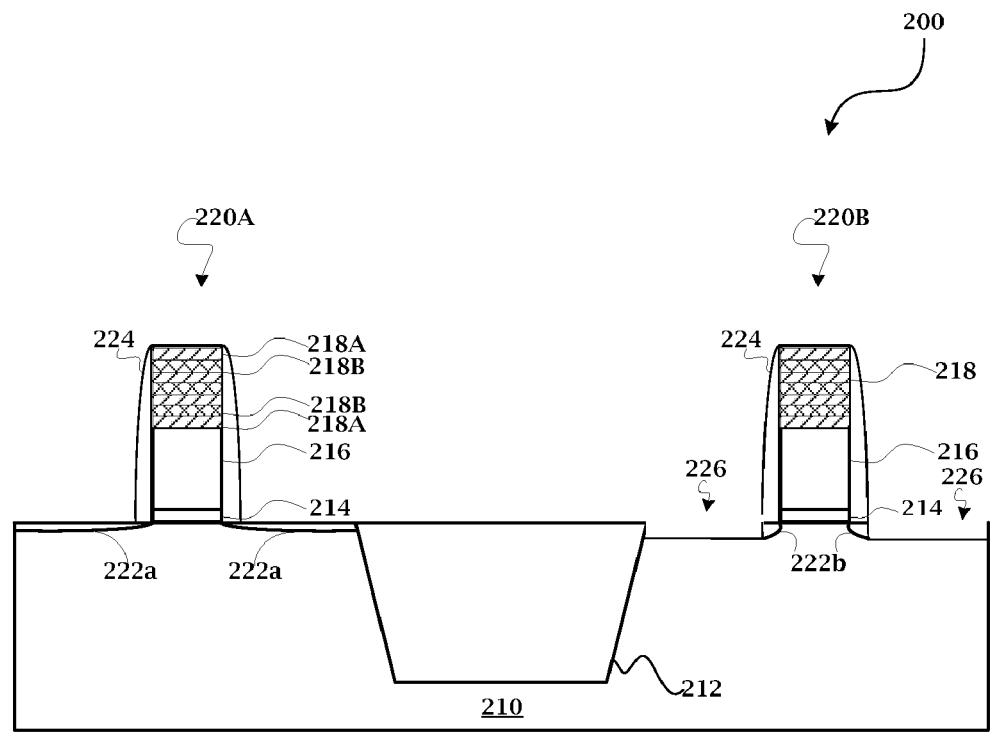

In one embodiment with reference to FIG. 2D, the method 100 proceeds to step 110 by forming offset spacers (or dummy spacers) 224 using any suitable process. The offset spacers 224 are positioned on each side of the gate stacks (i.e., gate dielectric layer 214, gate layer 216, and multi-layer hard mask layer 218) of the gate structures 220A, 220B (e.g., along the sidewalls of the gate dielectric layer 214/gate layer 216/multi-layer hard mask layer 218). In another embodiment, the offset spacers 224 are formed only on the gate structure 220B of the NMOS transistor. The offset spacers 224 includes silicon nitride, or alternatively other suitable dielectric material such as silicon oxide, silicon carbide, silicon oxynitride, and/or combinations thereof. In an example, the offset spacers 224 are formed by blanket depositing a dielectric layer over the semiconductor device 200, and then, anisotropically etching to remove the dielectric layer to form offset spacers 224 as illustrated in FIG. 2D. In furtherance of the offset spacers 224 of silicon nitride, a plasma dry etch is implemented utilizing a gas including CF4, CH3F, O2, Ar, or combinations thereof.

One or more source/drain regions may be formed for the gate structure 220B in the NMOS device region as illustrated in FIGS. 2D-2H. The gate structure 220A in the PMOS device may be protected during formation of the source/drain regions for the gate structure 220B in the NMOS region, and vice versa. For example, a photoresist layer may be deposited and patterned over the PMOS device region during formation of the source/drain regions for the gate structure 220B in the NMOS region.

Still referring to FIG. 2D, a pre-clean chemical, such as diluted hydrofluoric acid (DHF), is applied to the semiconductor substrate adjacent the gate structure 220B and within the NMOS region. In another embodiment, an etching process is implemented to form one or more trenches and/or recesses 226 on each side of the gate structure 220B by any suitable process. The recesses 226 are substantially aligned with offset spacers 224. The recesses 226 may be formed by a selective etching process, which can include one or more wet etching and/or dry etching processes. Thereafter a pre-clean chemical is applied to the semiconductor substrate to clean the recessed regions.

Figure 2E:
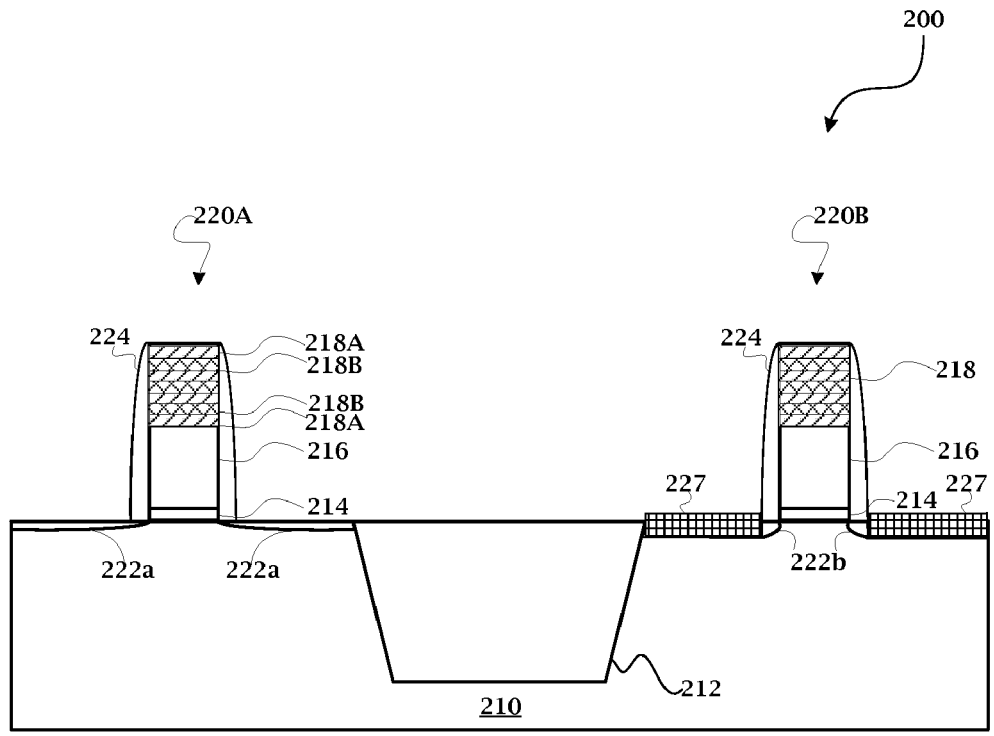

Then, the method proceeds to step 112 by forming an epitaxy layer 227 in the recessed or pre-cleaned regions as illustrated in FIG. 2E. The epitaxy layer 227 may be also referred to as raised lightly doped drain (RLDD) regions. In the present embodiment, the epitaxy layer 227 is formed with a suitable thickness tuned to the device performance and/or process integration. An exemplary thickness of the epitaxy layer 227 is approximately 200 Å. The epitaxy layer 227 can be formed by a suitable epitaxy growth technique, such as selective epitaxy growth (SEG), over the one or more recesses 226. Alternatively, the epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 210. The epitaxy layer 227 includes silicon, silicon carbide, other suitable semiconductor material, or combinations thereof. In the present embodiment, the epitaxy layer 227 includes epitaxially grown Si. In one embodiment, the offset spacers 224 are alternatively removed thereafter by a suitable process. In one example, a chemical including H3PO4 is applied to remove the offset spacers of silicon nitride.

Figure 2F:
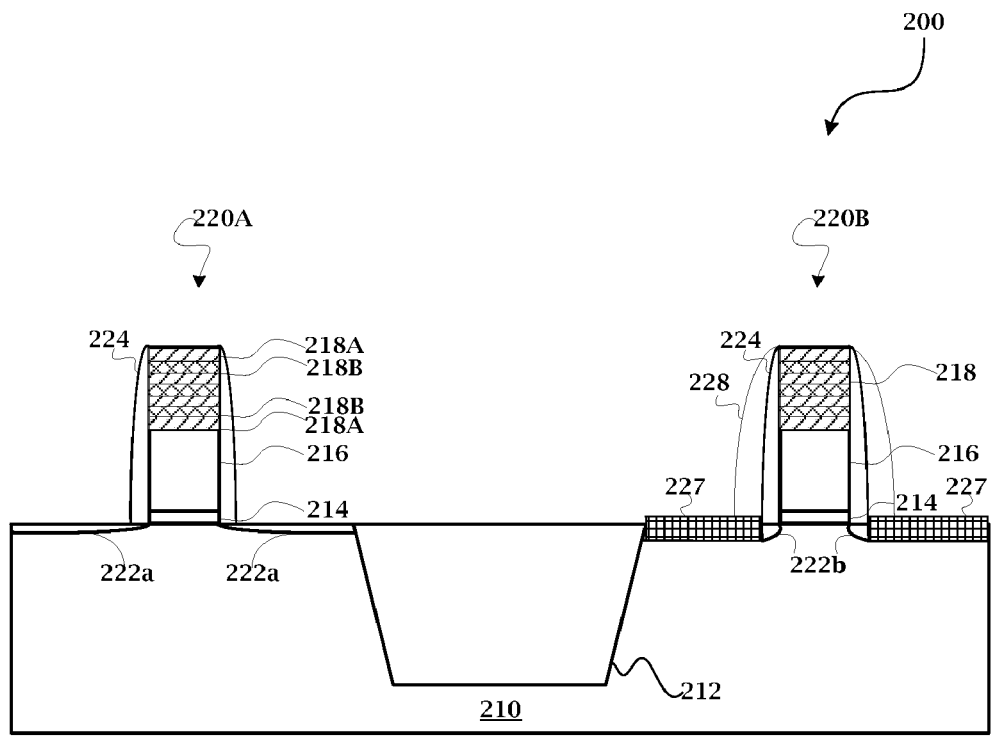

Referring to FIG. 2F, the method 100 proceeds to step 114 by forming main spacers 228 using a suitable process. The dummy spacers 228 are positioned on each side of a gate structure offset spacers, such as the gate structure 220B. The dummy spacers 228 may be similar to offset spacers 224. The dummy spacers 228 comprise a dielectric material, such as silicon nitride, silicon oxide, silicon carbide, silicon oxynitride, other suitable materials, and/or combinations thereof. In an example, the dummy spacers 228 are formed by blanket depositing a dielectric layer over the semiconductor device 200, and then, anisotropically etching to remove the dielectric layer. Similarly, in an example of the offset spacers 228 of silicon nitride, a plasma dry etch is applied to the silicon nitride layer utilizing a gas including $CF_4$, $CH_3F$, $O_2$, Ar, or combinations thereof.

Figure 2G:
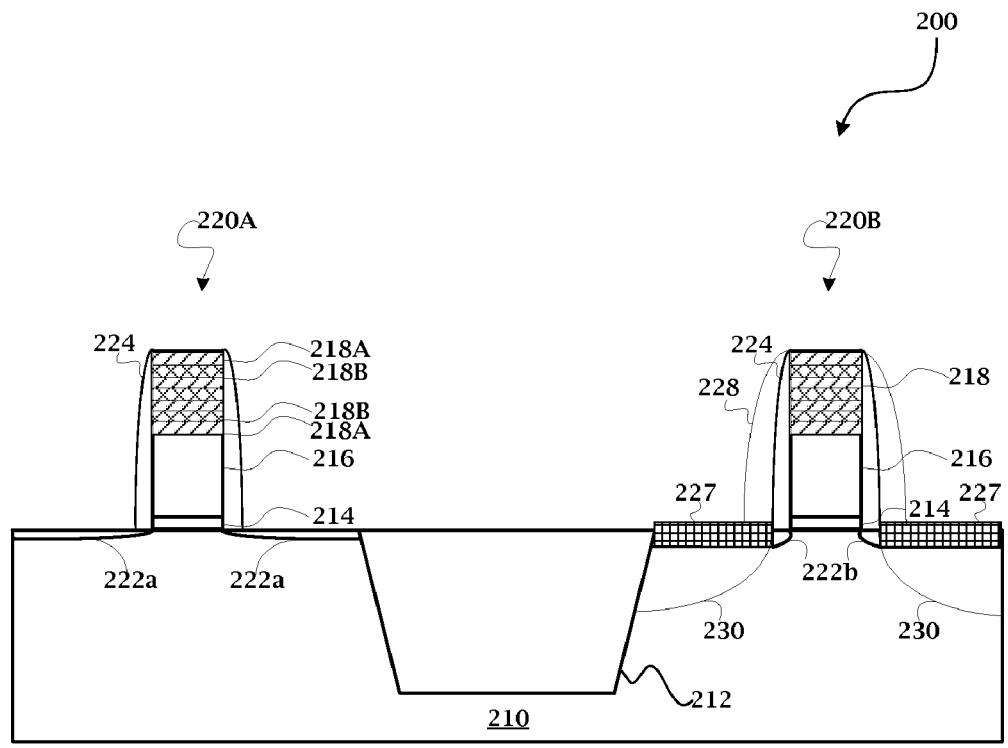
Figure 2H:
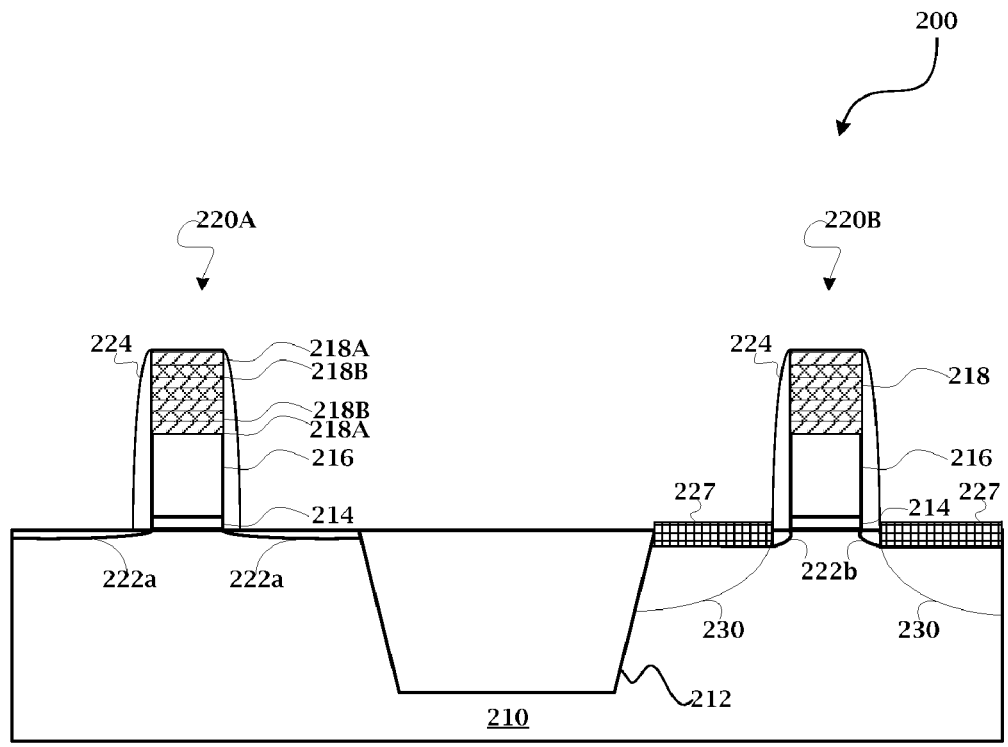

Referring to FIG. 2G, the method 100 proceeds to step 116 by forming source/drain (S/D) regions 230 (also referred to as heavily doped S/D regions) using one or more ion implantation processes, diffusion, and/or other suitable processes. The doping species may depend on the type of device being fabricated, such as an NMOS or PMOS device. For example, since the gate structure 220B is configured for an NMOS device region, the S/D regions 230 are doped with n-type dopants, such as phosphorus or arsenic. The S/D regions 230 may comprise various doping profiles. In one embodiment, the S/D regions 230 are self-aligned with the main spacers 228. Additionally, one or more annealing processes may be performed to activate the S/D regions 230. The annealing processes comprise rapid thermal annealing (RTA) and/or laser annealing processes. In one embodiment, the main spacers 228 are removed before the annealing process as illustrated in FIG. 2H. In some examples, before performing the annealing process, a resist protection oxide (RPO) layer may be deposited and patterned to protect various portions of the semiconductor device 200 from the annealing process. After the annealing process, the RPO layer may be removed by an etching process. During the various processing steps for forming main spacers 228 and forming S/D regions 230, the PMOS is protected by patterned photoresist layer or a patterned mask layer.

Figure 2I:
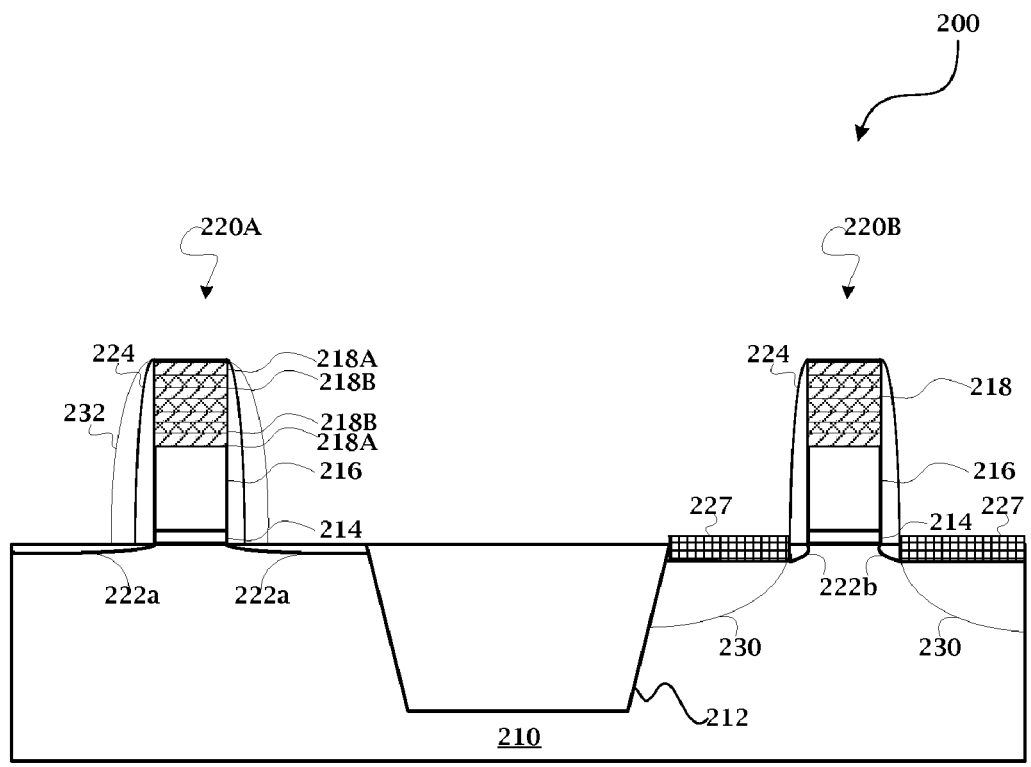
Figure 2J:
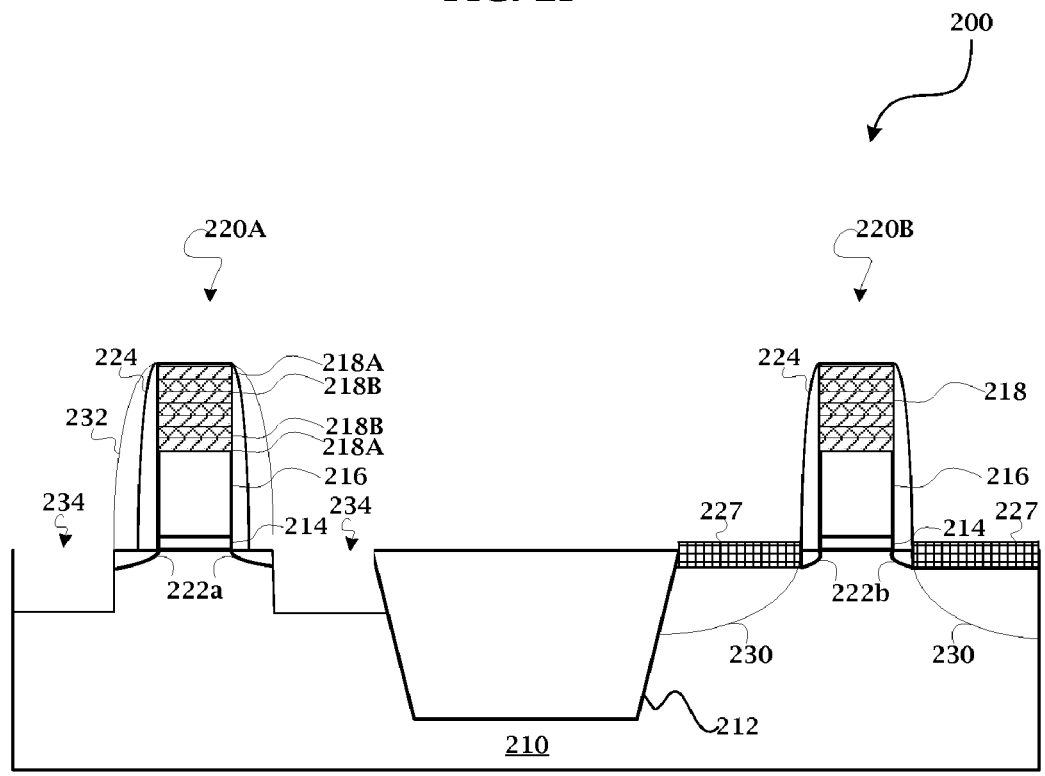
Figure 2K:
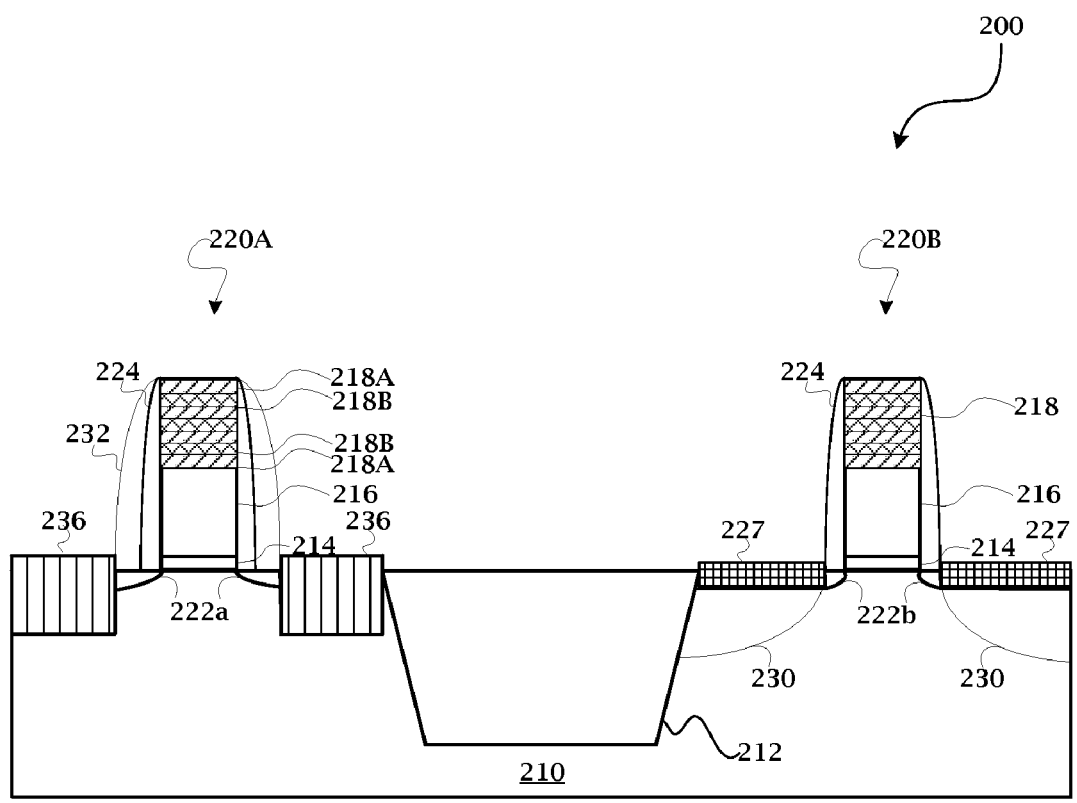
Figure 2L:
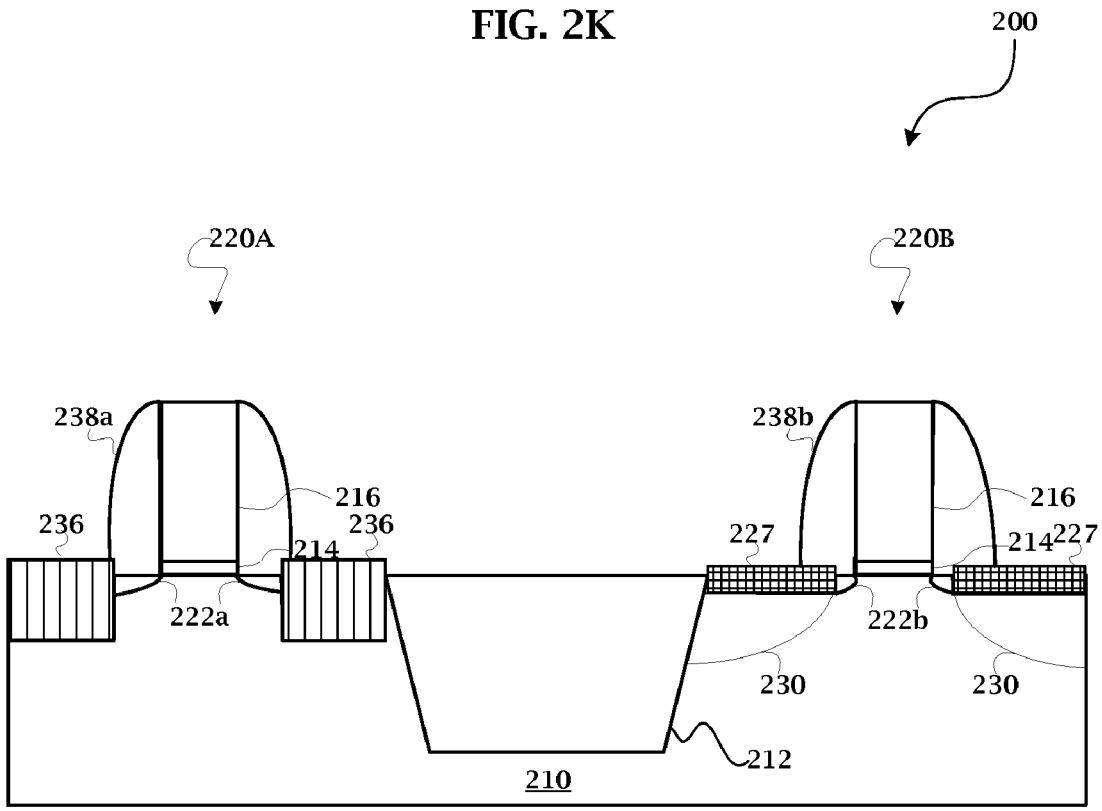

One or more source/drain regions may also be formed for the gate structure 220A in the PMOS device region as illustrated in FIGS. 2I-2K. The gate structure 220B in the NMOS device may be protected during formation of the source/drain regions for the gate structure 220A in the PMOS region. For example, a photoresist layer (not shown) may be deposited and patterned over the NMOS device region during formation of the source/drain regions for the gate structure 220A in the PMOS region.

Referring to FIG. 2I, the method 100 proceeds to step 118 by forming dummy spacers 232 using a suitable process. The dummy spacers 232 are positioned on each side of the gate stacks (i.e., gate dielectric layer 214, gate layer 216, and multi-layer hard mask layer 218) of the gate structure 220A (e.g., along the sidewalls of the gate dielectric layer 214/gate layer 216/multi-layer hard mask layer 218). The dummy spacers 232 comprise a dielectric material, such as silicon nitride, silicon oxide, silicon carbide, silicon oxynitride, other suitable materials, and/or combinations thereof. In an example, the dummy spacers 232 are formed by blanket depositing a dielectric layer over the semiconductor device 200, and then, anisotropically etching to remove the dielectric layer to form dummy spacers 232 as illustrated in FIG. 2I. In another embodiment, the dummy spacers 232 are formed on sides of the gate structure 220A and the gate structure 220B.

Referring to FIG. 2J, the method 100 proceeds to step 120 by forming one or more trenches and/or recesses 234 in the substrate 210. The one or more recesses 234 are formed on each side of the gate structure 220A by any suitable process. The recesses 234 are substantially aligned with dummy spacers 232. The recesses 234 may be formed by a selective etching process, which can include one or more wet etching and/or dry etching processes. In one embodiment, a plasma dry etching process is applied to the recesses 234 using a chemical including HBr, O2, He, or combinations thereof.

Then, the method 100 proceeds to step 122 by forming an epitaxy layer 236 using any suitable process in the one or more recesses 234 as illustrated in FIG. 2K. In the present embodiment, the epitaxy layer 236 are formed by one or more epitaxial growth processes to any suitable thickness. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxy layer 236 comprise a suitable semiconductor material for strained effect and/or other device performance enhancement. In the present embodiment, the epitaxy layer 236 comprise epitaxially grown SiGe. It is understood that a pre-cleaning process may be performed before the epitaxial growth process. the pre-cleaning process is applied to the recesses 234 to remove silicon oxide or other unexpected material negatively impacting the epitaxy growth. In one example, DHF is applied for the pre-cleaning.

The SiGe layer 236 are formed by epitaxial growth, presents another stage where the height of the multi-layer hard mask layer 218 is critical. For example, conventional single hard mask layers may be not have sufficient thickness by the time the SiGe epitaxy growth process is implemented. If the thickness/height is too low, mushroom side effects may occur. Mushroom side effects occur when portions of the gate stack, such as the gate layer 216 (i.e., polysilicon layer) are exposed because the overlying hard mask layer is too thin. The hard mask layer may become too thin during a pre-clean, such as a DHF pre-clean. This allows epitaxial growth on the corners of the gate stack, i.e., the polysilicon layer 216. Thus, it is desired for the hard mask layer remaining before the epitaxial growth process to exhibit a sufficient mushroom window, which means that the hard mask layer is thick enough to cover processing variations without risking mushroom side effects. The multi-layer hard mask layer 218 disclosed addresses this issue. Specifically, it has been observed that a hard mask layer height/thickness of 200 Å or greater may provide a sufficient mushroom window. The multi-layer hard mask layer 218 is thus tuned to exhibit a thickness/height of 200 Å or greater for the S/D formation process.

In one embodiment, the source and drain (S/D) regions to the PMOS associated with the gate structure 220A may be in-situ doped or undoped during the epitaxial growth. When the epitaxy layer 236 are undoped, it is understood that the undoped layers may be doped subsequently. The various implantation processes may comprise conventional ion implantation process, plasma immersion ion implantation (PIII) processes, gas and/or solid source diffusion processes, other suitable processes, and/or combinations thereof. The epitaxy layer 236 is also referred to as S/D regions 236. In another embodiment, the S/D regions 236 may further be exposed to annealing processes, such as a rapid thermal annealing process.

The semiconductor device 200 may undergo further CMOS or MOS technology processing to form various features known in the art. For example, referring to FIG. 2L, the method 100 may proceed to step 124 to form main spacers, such as main spacers 238a, 238b, by any suitable process, and the multi-layer hard mask layer 218 may be removed by any suitable process. The main spacers 238a, 238b are positioned on each side of the gate stacks (i.e., gate dielectric layer 214/gate layer 216) of the gate structures 220A, 220B (e.g., along the sidewalls of the gate dielectric layer 214/gate layer 216). The main spacers 238a, 238b comprise a dielectric material, such as silicon nitride, silicon oxide, silicon carbide, silicon oxynitride, other suitable materials, and/or combinations thereof. It is understood, though not shown, that the main spacers 238a, 238b may include the offset spacers 224 and/or dummy spacers 232. In one embodiment, the present step only forms the main spacers 238a on the sides of the gate structure 220A. In another embodiment, the various dummy spacers formed at previous steps are removed before the formation the main spacers 248a and 238b.

If the epitaxy layer 236 is undoped, then the source and drain to the PMOS transistor associated with the gate structure 220A are formed in the epitaxy layer 236 by a suitable process, such as ion implantation after the formation of the main spacers. Thus formed source and drain are self-aligned with the main spacers 238a.

One or more contact features (not shown), such as silicide regions, may also be formed. The contact features may be coupled to the S/D regions 227, 236. The contact features comprise silicide materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features are formed by any suitable process. For example, the contact features may be formed by a salicide (self-aligned silicide) process. A metal material may be deposited over the substrate, including over the substrate (e.g., silicon regions) and/or doped regions. After deposition, the salicidation process may continue with a reaction between the deposited metal material and the silicon regions at an elevated temperature that is selected based on the specific metal material or materials. The unreacted metal material is removed thereafter. The reacted silicide may require additional thermal process to reduce the resistance of the silicide.

Subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Subsequent processing may implement a gate replacement process. For example, a metal gate may replace the gate layer (i.e., polysilicon gate layer) of the gate structures 220A, 220B. A first metal gate having a first work function may be formed in the gate structure 220A, and a second gate structure having a second work function may be formed in the gate structure 220B. The first and second metal gates may comprise liner layers, work function layers, conductive layers, metal gate layers, fill layers, other suitable layers, and/or combinations thereof. The metal gates may comprise any suitable material including aluminum, copper, tungsten, titanium, tantulum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

In summary, a multi-layer hard mask layer is provided, which may be implemented in any process for fabricating an integrated circuit device (semiconductor device). The multi-layer hard mask layer described implements more than one layer. An exemplary multi-layer hard mask layer comprises alternating layers. The alternating layers may include at least a first layer having a higher processing resistance to oxygen plasma treatment and a second layer having a higher processing resistance to etching including dry etching and wet etching. The multi-layer hard mask layer can provide improved control over the thickness of the hard mask layer at various processing stages, providing improved, sufficient process windows without additional side effects (e.g., shadow effects and/or mushroom effects). The disclosed multi-layer hard mask layer may also be easily integrated into conventional integrated circuit processing, for example, by introducing additional gas lines into conventional processing tools to allow multiple layer deposition. It is understood that different embodiments may have different advantages, and that no particular advantage is necessarily required of any embodiment. In the present embodiment, the multi-layer hard mask layer includes alternating films or a plurality of dual film stacks. In another embodiment, the multi-layer hard mask layer includes a plurality of film stacks and each film stack additionally includes a third material film tuned to have a particular processing resistance to a certain chemical, such as an etchant used in one or more etching processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit device, the method comprising:
   forming gate material layers over a semiconductor substrate;
   forming a multi-layer hard mask layer over the gate material layers, wherein the multi-layer hard mask layer includes a plurality of dual films stacked together, each dual film having a first material film having a high resistance to an oxygen plasma process and a second material film having a high resistance to an etching process, each material film have a thickness less than about 10 angstrom;
   patterning the gate material layers utilizing the multi-layer hard mask layer;
   performing a tilt-angle ion implantation process to the semiconductor substrate, wherein the multi-layer hard mask layer has a thickness less than about 450 angstrom;
   thereafter performing, to the semiconductor substrate, various processes including etching and oxygen plasma treatment; and
   thereafter performing an epitaxy growth to the semiconductor substrate while the multi-layer hard mask layer has a thickness greater than about 200 angstrom, wherein performing the epitaxy growth process to the semiconductor substrate forms an epitaxial source region and an epitaxial drain region, the gate structure interposing the epitaxial source region and the epitaxial drain region.

2. A method for fabricating an integrated circuit device, the method comprising:
providing a semiconductor substrate;
forming gate material layers over the semiconductor substrate;
forming a multi-layer hard mask layer over the gate material layers, wherein the multi-layer hard mask layer includes a plurality of film stacks configured such that the multi-layer hard mask layer has a first thickness during a tilt-angle ion implantation process and a second thickness during an epitaxy growth process, each film stack having a first material film having a high resistance to an oxygen plasma process and a second material film having a high resistance to an etching process;
patterning and etching the multi-layer hard mask layer and the gate material layers to form a gate stack, wherein the multi-layer hard mask layer has the first thickness after the patterning and etching;
thereafter, performing the tilt-angle ion implantation process to the semiconductor substrate to form a source region and a drain region, the gate stack interposing the source region and the drain region;
thereafter, performing various processes to the semiconductor substrate, wherein the multi-layer hard mask layer has the second thickness after the various processes; and
thereafter, performing the epitaxy growth process to the semiconductor substrate to form an epitaxial source region and an epitaxial drain region, the gate structure interposing the epitaxial source region and the epitaxial drain region.

3. The method of claim 2 wherein each of the first and second material films has a thickness less than or equal to about 5 angstrom.

4. The method of claim 2 wherein the first material film includes silicon oxide and the second material film includes SiOC.

5. The method of claim 2 wherein the second material film includes at least one of SiCN and SiC.

6. The method of claim 2 wherein the multi-layer hard mask layer comprises at least four pairs of film stacks.

7. The method of claim 2 wherein
the first thickness is less than or equal to approximately 450 Å when the tilt-angle ion implantation process is performed, and
second thickness is greater than or equal to approximately 200 Å when the epitaxial growth is performed.

8. The method of claim 2 wherein performing the tilt-angle ion implantation process comprises utilizing a tilt-angle greater than or equal to approximately 25°.

9. The method of claim 8 wherein the first material film includes silicon oxide and the second material film includes at least one of a SiOC, SiCN, or SiC material.

10. The method of claim 9 wherein performing the various processes further includes applying a wet etching process to recess the semiconductor substrate.

11. The method of claim 8 wherein performing the various processes includes
performing a plasma etching process to form gate spacers;
performing an oxygen plasma ashing process to remove a photoresist layer;
performing a wet etching to remove the gate spacers; and
performing a clean process using diluted hydrofluoric acid.

12. A method for fabricating an integrated circuit device, the method comprising:
providing a semiconductor substrate;
forming gate material layers over the semiconductor substrate;
forming a multi-layer hard mask layer over the gate material layers, wherein the multi-layer hard mask layer has a first thickness, and further wherein the multi-layer hard mask layer includes a plurality of film stacks, each film stack having a silicon oxide layer and a carbon-containing material layer, each film stack having a thickness equal to or less than about 10 angstrom;
patterning and etching the multi-layer hard mask layer and the gate material layers to form a gate structure that includes the multi-layer hard mask layer and the gate material layers, wherein the multi-layer hard mask layer has a second thickness after the patterning and etching, the second thickness being less than the first thickness;
thereafter, performing a tilt-angle ion implantation process to the semiconductor substrate to form a source region and a drain region, the gate structure interposing the source region and the drain region,
thereafter, performing various processes, wherein the multi-layer hard mask layer has a third thickness after the various processes, the third thickness being less than the second thickness; and
thereafter, performing an epitaxy growth to the semiconductor substrate to form an epitaxial source region and an epitaxial drain region, the gate structure interposing the epitaxial source region and the epitaxial drain region.

13. The method of claim 12 wherein the carbon-containing material layer comprises a material selected from the group consisting of SiOC, SiCN, SiC, and combinations thereof.

14. The method of claim 12 wherein the forming of the multi-layer hard mask layer comprises implementing various plasma enhanced chemical vapor deposition (PECVD) processes.

15. The method of claim 12 wherein the performing various processes includes performing a dry etching process to form gate spacers; performing a wet etching process to recess the semiconductor substrate; and performing an oxygen plasma ashing to remove a photoresist layer.

16. The method of claim 12, wherein each film stack includes another material layer of a dielectric material different from silicon oxide and the carbon-containing material.

17. The method of claim 12 wherein the second thickness is less than or equal to approximately 450 Å and the tilt-angle ion implantation process forms light doped source/drain (LDD) features.

18. The method of claim 17 wherein the third thickness is greater than or equal to approximately 200 Å.

19. The method of claim 12 wherein performing the tilt angle ion implantation process comprises utilizing a tilt-angle of approximately 25°.

20. The method of claim 12 wherein performing the epitaxial growth comprises forming a silicon germanium epitaxial process in source and drain regions interposed by the gate structure.

21. The method of claim 12 wherein the forming the multi-layer hard mask layer includes configuring the plurality of film stacks such that the second thickness is a thickness that minimizes shadow effects from the tilt-angle ion implantation process and the third thickness is a thickness that minimizes mushroom effects from the epitaxy growth.

* * * * *